(12) United States Patent
Wu et al.

(10) Patent No.: US 9,955,586 B2
(45) Date of Patent: Apr. 24, 2018

(54) BALL GRID ARRAY FORMED ON PRINTED CIRCUIT BOARD

(71) Applicant: REALTEK SEMICONDUCTOR CORP., Hsinchu (TW)

(72) Inventors: Ting-Ying Wu, Hsinchu County (TW); Cheng-Lin Wu, Kaohsiung (TW); Chin-Yuan Lo, Hsinchu (TW); Wen-Shan Wang, Hsinchu County (TW)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 90 days.

(21) Appl. No.: 14/800,751

(22) Filed: Jul. 16, 2015

(65) Prior Publication Data

US 2016/0021745 A1 Jan. 21, 2016

(30) Foreign Application Priority Data

Jul. 18, 2014 (TW) .............................. 103124737 A

(51) Int. Cl.
*H05K 7/10* (2006.01)
*H05K 3/34* (2006.01)
*H01L 23/498* (2006.01)
*H01L 23/50* (2006.01)
*H05K 7/00* (2006.01)
*H05K 7/12* (2006.01)
*H05K 1/02* (2006.01)

(52) U.S. Cl.
CPC ..... *H05K 3/3436* (2013.01); *H01L 23/49816* (2013.01); *H01L 23/50* (2013.01); *H05K 1/0215* (2013.01); *H01L 23/49838* (2013.01); *H01L 2924/0002* (2013.01); *H05K 1/0289* (2013.01); *H05K 2201/10159* (2013.01); *H05K 2201/10704* (2013.01); *H05K 2201/10712* (2013.01); *H05K 2201/10719* (2013.01); *H05K 2201/10734* (2013.01); *Y02P 70/613* (2015.11)

(58) Field of Classification Search
CPC .......... H05K 2201/10734; H05K 2201/10719; H05K 2201/10704; H05K 2201/10712; H05K 1/0289
USPC ............... 361/767, 771, 772, 777, 791, 808; 174/250, 261, 263; 257/697, E23.069
See application file for complete search history.

(56) References Cited

U.S. PATENT DOCUMENTS

| 2007/0188997 A1* | 8/2007 | Hockanson | G06F 1/182 361/760 |
| 2012/0269489 A1* | 10/2012 | Park | H01L 23/49816 386/224 |
| 2013/0048364 A1* | 2/2013 | Shiu | H05K 1/0219 174/261 |

FOREIGN PATENT DOCUMENTS

TW 201311062 A1 3/2013

\* cited by examiner

*Primary Examiner* — Binh Tran
(74) *Attorney, Agent, or Firm* — Li & Cai Intellectual Property (USA) Office

(57) ABSTRACT

A Ball Grid Array (BGA) formed on printed circuit board is provided. The BGA comprises a first solder ball module and a second solder ball module. The first solder ball module comprises a plurality of first solder balls, wherein one of the first solder balls is grounded for shielding two other first solder balls, and one of the first solder balls is floating. The second solder ball module comprises a plurality of second solder balls, wherein two of the second solder balls are grounded and one of the two grounded second solder balls penetrates the printed circuit board through a plated through hole formed on the printed circuit board for shielding two first solder balls among the first solder balls.

18 Claims, 4 Drawing Sheets

BALL GRID ARRAY FORMED ON PRINTED CIRCUIT BOARD

BACKGROUND

1. Technical Field

The present disclosure relates to ball grid array disposed on printed circuit board, in particular, to a ball grid array having good ground shielding.

2. Description of Related Art

In order to electrically connect a ball grid array (BGA) packaged chip to a printed circuit board, a BGA corresponding to the packaged chip must be provided on the printed circuit board. The BGA provided on the printed circuit board generally is formed of a plurality of solder balls, a few of which are connected to ground to provide ground shielding to the remaining solder balls. However, the arrangement of a BGA on a printed circuit board is not necessarily regularly patterned. That is, the shape of the BGA as well as the number and positions associated with the grounded solder balls may vary along with different chips.

Since a conventional arrangement of solder balls does not have a regulated pattern, and solder balls may be arranged in a scattered manner with a low density, therefore, the usable area of the printed circuit board is often underutilized. Moreover, in practice a custom design of a BGA is unlikely to be repeatedly used, and manpower is required for verifying the performance of a BGA.

SUMMARY

Accordingly, the present disclosure provides a ball grid array configured to have a more regulated solder ball arrangement and occupy a smaller area on a printed circuit board for resolving the issue described.

An exemplary embodiment of the present disclosure provides a ball grid array (BGA) formed on a printed circuit board. The BGA includes a first solder ball module and a second solder ball module. The first solder ball module comprises a plurality of first solder balls arranged to form a first array, wherein one of the first solder balls is grounded for shielding two other first solder balls among the first solder balls of the first solder ball module, and one of the first solder balls is floating. The second solder ball module comprises a plurality of second solder balls arranged to form a second array, wherein two of the second solder balls are grounded and one of the two grounded solder balls penetrates the printed circuit board through a plated through hole formed on the printed circuit board for shielding two first solder balls of the first solder ball module. The first array is defined as the first three rows of the BGA. The second array is disposed adjacent to the first array and the second array is defined as the last three rows of the BGA, wherein the ratio of the number of first solder balls used for receiving signals to the number of first solder balls grounded is 4 to 1.

Another exemplary embodiment of the present disclosure provides a BGA formed on a printed circuit board, and the BGA includes a first solder ball module and a second solder ball module. The first solder ball module comprises a plurality of first solder balls arranged to form a first array, wherein two of the first solder balls are grounded for shielding the remaining first solder balls of the first solder ball module. The second solder ball module comprises a plurality of second solder balls arranged to form a second array, wherein two of the second solder balls are grounded, wherein the first array is defined as the first three rows of the BGA, and the second array disposed adjacent to the first array is defined as the last three rows of the BGA, wherein the ratio of the number of first solder balls used for receiving signals to the number of first solder balls grounded is 2 to 1.

An exemplary embodiment of the present disclosure provides a BGA formed on a printed circuit board, and the BGA includes a first solder ball module and a second solder ball module. The first solder ball module comprises a plurality of first solder balls arranged to form a first array, wherein at least three of the first solder balls are either grounded or electrically connected to a power line to receive a power voltage applied for shielding the remaining first solder balls of the first solder module, and one of the first solder balls is floating. The second solder ball module comprises a plurality of second solder balls arranged to form a second array. The configuration, the number and the disposition associated with the second solder balls are substantially the same as that of the first solder balls of the first solder ball module. The first array is defined as the first three rows of the BGA, and the second array disposed adjacent to the first array is defined as the last three rows of the BGA.

To sum up, exemplary embodiments of the present disclosure provide BGAs, which, by grounding one of a plurality of solder balls to shield two other first solder balls and having one of the grounded first solder balls penetrating the printed circuit board through a plated through hole to shield the two other first solder balls, can enable the BGA formed to have a more regulated solder ball arrangement and require fewer grounded solder balls for achieving good shielding performance while occupying smaller area on the printed circuit board. In comparison to the solder ball arrangement of a conventional BGA having irregular patterns, the BGA design provided by the present disclosure can easily be utilized repeatedly and therefore reduces manpower required for verifying the performance of the BGA.

In order to further understand the techniques, means and effects of the present disclosure, the following detailed descriptions and appended drawings are hereby referred to, such that, and through which, the purposes, features and aspects of the present disclosure can be thoroughly and concretely appreciated; however, the appended drawings are merely provided for reference and illustration, without any intention to be used for limiting the present disclosure.

BRIEF DESCRIPTION OF THE DRAWINGS

The accompanying drawings are included to provide a further understanding of the present disclosure, and are incorporated in and constitute a part of this specification. The drawings illustrate exemplary embodiments of the present disclosure and, together with the description, serve to explain the principles of the present disclosure.

DESCRIPTION OF THE EXEMPLARY EMBODIMENTS

Figure 1:
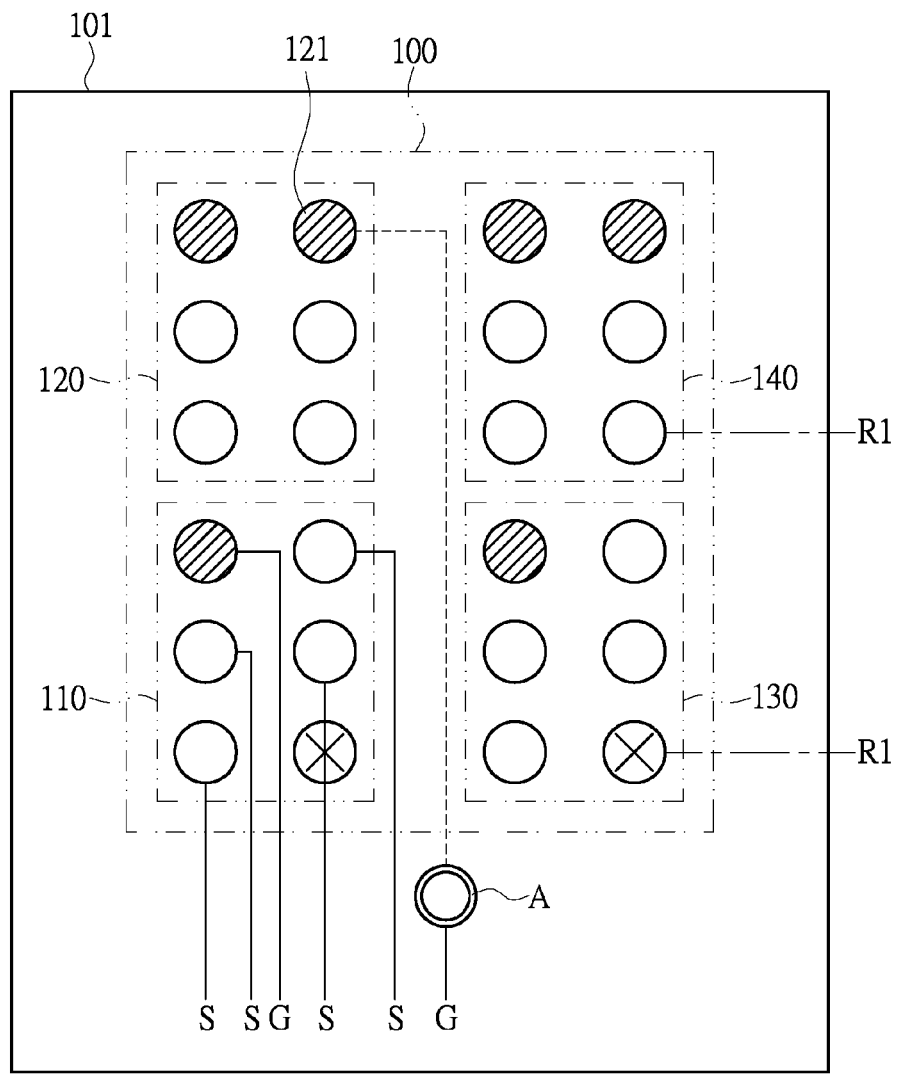
FIG. 1 is a schematic diagram of a ball grid array formed on a printed circuit board provided in accordance to an exemplary embodiment of the present disclosure.

Reference will now be made in detail to the exemplary embodiments of the present disclosure, examples of which are illustrated in the accompanying drawings. Wherever possible, the same reference numbers are used in the drawings and the description to refer to the same or like parts.

It shall be understood that, although terms such as first, second, third, and the like, may be used herein to describe various elements, components, regions, layers and/or sections, the elements, the components, regions, layers and/or sections described should not be limited by these terms. These terms are merely used for distinguishing one element, component, region, layer or section from another element, component, region, layer or section. Thus, a first element, component region, layer or section discussed below could be termed a second element, component region, layer or section, and vice versa without departing from the teachings of the present disclosure. Additionally, as used herein, the term "and/or" includes any and all combinations of one or more of the associated listed items.

First Exemplary Embodiment of a Ball Grid Array

Figure 2:
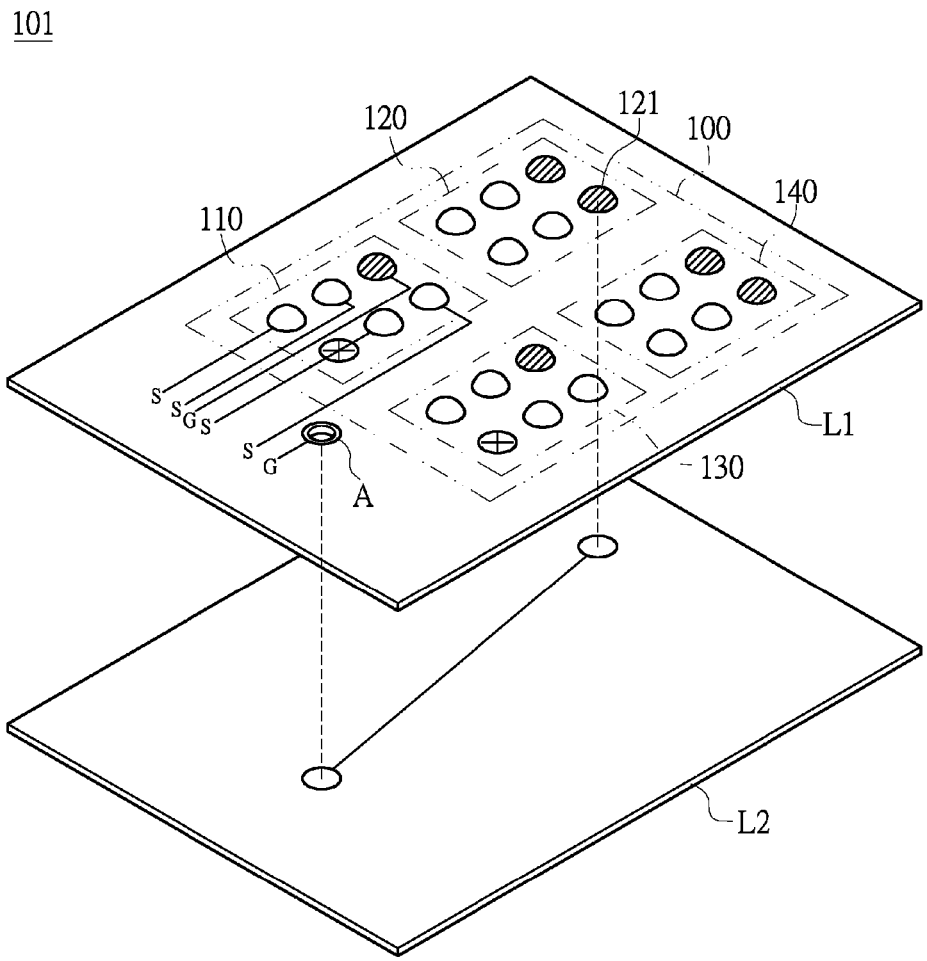
FIG. 2 is an isometric view of the BGA formed on the printed circuit board depicted in FIG. 1 provided in accordance to the exemplary embodiment of the present disclosure.

Please refer to FIG. 1 and FIG. 2 at the same time, which shows a schematic diagram of a ball grid array (BGA) formed on a printed circuit board provided in accordance to an exemplary embodiment of the present disclosure. FIG. 2 is an isometric view of the BGA formed on the printed circuit board depicted in FIG. 1 provided in accordance to the exemplary embodiment of the present disclosure. As shown in FIG. 1, a BGA 100 formed on a printed circuit board 101 includes a first solder ball module 110, a second solder ball module 120, a third solder ball module 130, and a fourth solder ball module 140. The first solder ball module 110 and the third solder ball module 130 employ substantially the same solder ball arrangement while the second solder ball module 120 and the fourth solder ball module 140 employ substantially the same solder ball arrangement. In the instant embodiment, each one of the solder ball modules 110, 120, 130, and 140 comprises six solder balls forming a 2 by 3 array. That is, each row of the solder ball module (110, 120, 130, or 140) contains two solder balls and each column of the solder ball module (110, 120, 130, or 140) contains three solder balls. Only one solder ball of the first solder ball module is grounded and the grounded first solder ball is located at the third row of the first solder ball module 110. Moreover, the printed circuit board 101 may be a two-layer printed circuit board (i.e., having an upper board L1 and a lower board L2), and the BGA 100 of the instant embodiment can be applied to a double-data-rate (DDR) dynamic random access memory (DRAM).

In the instant embodiment, the first solder ball module 110 comprises a plurality of first solder balls arranged to form a first array (i.e., a 2 by 3 array), wherein one of the first solder balls is grounded (e.g., a ground solder ball) for shielding two other first solder balls (e.g., signal solder balls) among the first solder balls, and one of the first solder balls is floating (e.g., floating solder ball). The second solder ball module 120 comprises a plurality of second solder balls arranged to form a second array (i.e., a 2 by 3 array), wherein two of the second solder balls are grounded. The first array is defined as the first three rows of the BGA 100 and the second array disposed adjacent to the first array is defined as the last three rows of the BGA 100. Additionally, it may be noted from FIG. 1, the first row R1 of the first solder ball module 110 is configured to face the signal traces disposed on the printed circuit board 101 connecting (or inputting into) the first solder ball module 110, and the grounded first solder ball is located at the third row of the first solder ball module 110 while the floating first solder ball is located at the first row R1 of the first solder ball module 110. In the instant embodiment, the number of second solder balls disposed in the second solder ball module 120 is equal to the number of first solder balls disposed in the first solder ball module 110. The grounded second solder balls are located at the third row of the second solder ball module 120. It shall be noted that the center-to-center distance between the two first solder balls of the first solder ball module 110 is substantially 0.8 mm. Moreover, the ratio of the number of the first solder balls connecting to the signal line (i.e., the number of signal solder balls) to the number of first solder balls grounded (i.e., the number of ground solder balls) is 4 to 1. The BGA 100 of the instant embodiment has one of the second solder balls (e.g., a solder ball 121) penetrating the printed circuit board 101 through a plated through hole (e.g., a plated through hole A) for shielding two other first solder balls (e.g., the signal solder balls) among the first solder balls of the first solder ball module 110, such that for every two signal lines, there is one ground line G disposed next to them, thereby the BGA 100 formed therefrom can provide a complete ground shield effect. In comparison to the solder ball arrangement of a conventional BGA having irregular patterns, the BGA design provided by the present disclosure can easily be utilized repeatedly and therefore can reduce the amount of manpower required for verifying the performance of the BGA.

Moreover, the BGA 100 further includes the third solder ball module 130 and the fourth solder ball module 140. The third solder ball module 130 is disposed parallel to the first solder ball module 110. The solder ball module 130 comprises a plurality of third solder balls, wherein one of the third solder balls is grounded for shielding two other third solder balls of the third solder balls and one of the third solder balls is floating. The third solder ball module 130 employs substantially the same solder ball arrangement and definitions for solder balls thereof as the first solder ball module 110. The fourth solder ball module 140 comprises a plurality of fourth solder balls, wherein two of the fourth solder balls are grounded and one of the grounded fourth solder balls penetrates the printed circuit board 101 through a plated through hole for shielding two of the third solder balls. The fourth solder ball module 140 employs substantially the same solder ball arrangement and definitions for solder balls thereof as the second solder ball module 120. Likewise, the first row R1 of the third solder ball module 130 is configured to face the signal traces disposed on the printed circuit board 101 connecting (or inputting into) the third solder ball module 130. The grounded third solder ball is located at the third row of the third solder ball module 130 and the floating third solder ball is located at the first row of the third solder ball module 130. In the instant embodiment, the number of the fourth solder balls disposed in the fourth solder ball module 140 is equal to the number of the third solder balls disposed in the third solder ball module 130. Moreover, the grounded fourth solder ball is located at the third row of the fourth solder ball module 140. Other descriptions related the third and the fourth solder ball modules 130 and 140 are similar to those described above for the first and the second solder modules 110 and 120, hence further descriptions are hereby omitted.

Various embodiments will be provided in the following to provide more understanding over the present disclosure, however only parts that are different from the embodiment depicted in FIG. 1 will be described in detail and parts that are similar to those described previously will be omitted. Moreover, for ease of reference, the same or similar parts or features will be given with the same or similar reference number.

Second Exemplary Embodiment of a Ball Grid Array

Figure 3:
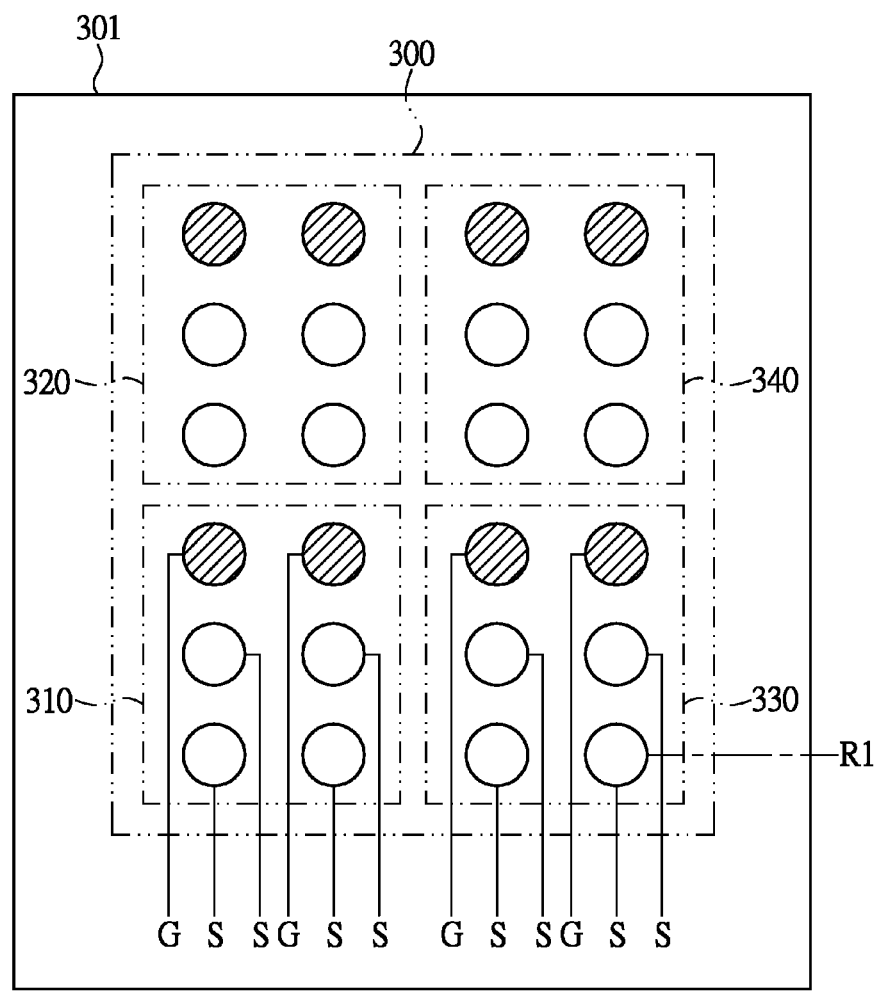
FIG. 3 is a schematic diagram of a ball grid array formed on a printed circuit board provided in accordance to another exemplary embodiment of the present disclosure.

Please refer to FIG. 3, which shows a schematic diagram of a BGA formed on a printed circuit board provided in accordance to another exemplary embodiment of the present disclosure. As shown in FIG. 3, a BGA 300 formed on a printed circuit board 301 includes a first solder ball module 310, a second solder ball module 320, a third solder ball module 330, and a fourth solder ball module. The first and the third solder ball modules 310, 330 employ substantially the same solder ball arrangement while the second and the fourth solder ball modules 320, 340 employ substantially the same solder ball arrangement. In the instant embodiment, each one of the solder ball modules 310, 320, 330, and 340 comprises six solder balls forming a 2 by 3 array. That is, each row of the solder ball module (310, 320, 330, or 340) contains two solder balls and each column of the solder ball module (310, 320, 330, or 340) contains three solder balls. Two solder balls in the first solder ball module 310 are grounded. The grounded first solder balls are located at the third row of the first solder ball module 310. Moreover, the printed circuit board 301 may be a single-sided or a two-layer printed circuit board and the BGA 300 of the instant embodiment can be applied to a double-data-rate (DDR) dynamic random access memory (DRAM).

In the instant embodiment, the first solder ball module 310 comprises a plurality of first solder balls arranged to form a first array (i.e., a 2 by 3 array), wherein two of the first solder balls are grounded (e.g., ground solder balls) for shielding the remaining solder balls (e.g., signal solder balls). The second solder ball module 320 comprises a plurality of second solder balls arranged to form a second array (i.e., a 2 by 3 array), wherein two of the second solder balls are grounded. The first array is defined as the first three rows of the BGA 300 and the second array disposed adjacent to the first array is defined as the last three rows of the BGA 300. Additionally, it can be noted from FIG. 3, the first row R1 of the first solder ball module 310 is configured to face the signal traces disposed on the printed circuit board 301 connecting (or inputting into) the first solder ball module 310. The grounded first solder balls are located at the third row of the first solder ball module 310. In the instant embodiment, the number of the second solder balls disposed in the second solder ball module 320 is equal to the number of the first solder balls disposed in the first solder ball module 310. The grounded second solder balls are located at the third row of the second solder ball module 320. It shall be noted that the center-to-center distance between the two first solder balls of the first solder ball module 310 is substantially 1 mm. The ratio of the number of first solder balls connecting to the signal lines (i.e., the number of signal solder balls) to the number of the first solder balls grounded (i.e., the number of ground solder balls) is 2 to 1. Therefore, the BGA 300 of the instant embodiment are routed by the traces on a package chip in such a way that one ground line G is disposed for every two signal lines S (i.e., without the need of forming the plated through hole described in FIG. 1), so that the BGA formed therefrom can provide a complete ground shield effect.

Additionally, the BGA 300 of the instant embodiment further includes a third solder ball module 330 and a fourth solder ball module 340. The third solder ball module 330 is disposed in parallel to the first solder ball module 310. The third solder ball module 330 comprises a plurality of third solder balls, wherein two of the third solder balls are grounded (e.g., ground solder balls) for shielding the remaining third solder balls. The third solder ball module 330 employs substantially the same solder ball arrangement and definitions for solder balls thereof as the first solder ball module 310. The fourth solder ball module 340 comprises a plurality of fourth solder balls, wherein two of the fourth solder balls are grounded. The fourth solder ball module 340 employs substantially the same solder ball arrangement and definitions for solder balls thereof as the second solder ball module 320. The first row R1 of the third solder ball module 330 is configured to face the signal traces disposed on the printed circuit board 301 connecting (or inputting into) the third solder ball module 330, and the grounded third solder balls are located at the third row of the third solder ball module 330. In the instant embodiment, the number of the fourth solder balls disposed in the fourth solder ball module 340 is equal to the number of the third solder balls disposed in the third solder ball module 330. Moreover, the grounded fourth solder balls are located at the third row of the fourth solder ball module 340. Other descriptions related the third and the fourth solder ball modules 330 and 340 are similar to those described above for the first and the second solder modules 310 and 320, hence further descriptions are hereby omitted.

Various embodiments will be provided in the following to provide more understanding over the present disclosure, however only parts that are different from the embodiment depicted in FIG. 3 will be described in detail and parts that are similar to those described previously will be omitted. Moreover, for ease of reference, same or similar parts or features will be given with same or similar reference number.

Third Exemplary Embodiment of a Ball Grid Array

Figure 4:
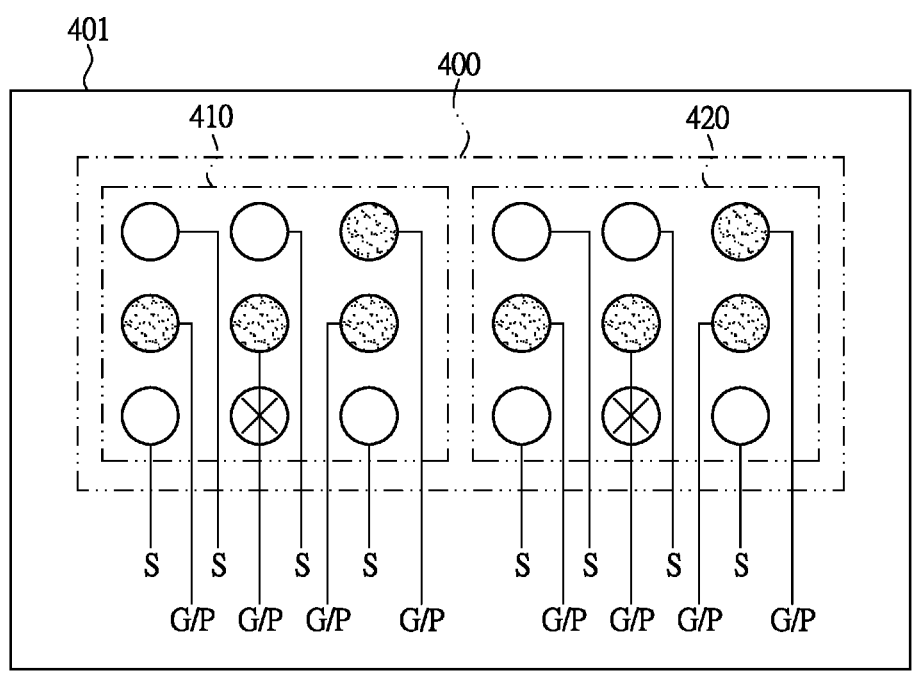
FIG. 4 is a schematic diagram of a ball grid array formed on a printed circuit board provided in accordance to another exemplary embodiment of the present disclosure.

Please refer to FIG. 4, which shows a schematic diagram of a BGA formed on a printed circuit board provided in accordance to another exemplary embodiment of the present disclosure. As shown in FIG. 4, a BGA 400 formed on a printed circuit board 401 includes a first solder ball module 410 and a second solder ball module 420. The first and the second solder ball modules 410, 420 employ substantially the same solder ball arrangement. In the instant embodiment, each one of the solder ball modules 410 and 420 comprises nine solder balls forming a 3 by 3 array. That is, each row of the solder ball module (410 or 420) contains three solder balls and each column of the solder ball module (410 or 420) contains three solder balls. Each of the solder ball modules 410 and 420 has nine solder balls. In the instant embodiment, four solder balls of the first solder ball module 410 are grounded. Three of the grounded first solder balls are located at the second row of the first solder ball module 410 and one of the grounded first solder balls is located at the third row of the first solder ball module 410. The first row R1 of the first solder ball module 410 (i.e., the bottom row of the BGA 400) is configured to face the signal traces disposed on the printed circuit board 401 connecting (or inputting into) the first solder ball module 410. The first solder balls, which are grounded or electrically connected to ground, are located at the second row of the first solder ball module 410. One of the first solder balls is floating and is located at the first row of the first solder ball module 410. Moreover, the printed circuit board 401 may be a single-sided or a two-layer printed circuit board and the BGA 400 of the instant embodiment can be applied to a double-data-rate (DDR) dynamic random access memory (DRAM).

In short, the first solder ball module 410 of the instant embodiment comprises a plurality of first solder balls arranged to form a first array, wherein at least three of the first solder balls are grounded or electrically connected to a power line to receive a power voltage applied (there are four first solder balls in the instant embodiment, e.g., ground or power solder balls) for shielding the remaining first solder balls of the first solder module 410 (e.g., the signal solder balls) and one of the first solder balls is floating (e.g., the floating solder ball). The second solder ball module 420 comprises a plurality of second solder balls arranged to form a second array. The configuration, the number, and the disposition associated with the second solder balls in the second solder ball module 420 are substantially the same as that of the first solder balls in the first solder ball module 410. The first array is defined as the first three rows of the BGA 400, and the second array disposed adjacent to the first array is defined as the last three rows of the BGA 400. It is worth to note that with the solder ball arrangement of the BGA provided by the instant embodiment, either one ground line G or one power line P is disposed next to each signal line S, so that the BGA formed therefrom can provide a complete shielding effect. If the ground/power solder balls in one embodiment are all configured to be ground solder balls such that there is one ground line next to every signal line, then good grounding shield can be achieved.

In summary, exemplary embodiments of the present disclosure provide BGAs, which by grounding one of a plurality of solder balls to shield two other first solder balls and having one of the grounded first solder balls penetrating the printed circuit board through a plated through hole to shield two other first solder balls, can enable the BGA to have a more regulated solder ball arrangement and require fewer grounded solder balls for achieving good shielding performance while occupying smaller area on the printed circuit board. In comparison to the solder ball arrangement of a conventional BGA having irregular patterns, the BGA design provided by the present disclosure can easily be utilized repeatedly and therefore reduces manpower required for verifying the performance of the BGA.

The above-mentioned descriptions represent merely the exemplary embodiment of the present disclosure, without any intention to limit the scope of the present disclosure thereto. Various equivalent changes, alternations or modifications based on the claims of present disclosure are all consequently viewed as being embraced by the scope of the present disclosure.

What is claimed is:

1. A Ball Grid Array (BGA) formed on a printed circuit board (PCB), the BGA comprising:
    a first solder ball module comprising a plurality of first solder balls arranged to form a first array, wherein the first solder balls includes a plurality of first signal solder balls respectively coupled to a plurality of first signal lines, a first grounded solder ball coupled to a first ground line, and a first floating solder ball; and
    a second solder ball module comprising a plurality of second solder balls arranged to form a second array, wherein the second solder balls includes two second grounded solder balls and one of the two second grounded solder halls is coupled to a second ground line;
    wherein at least a portion of the second ground line coupled to the grounded solder ball of the second solder ball module penetrates the PCB and is disposed adjacent to two of the first signal lines coupled to first solder balls of the first solder ball module, such that the second ground line shields the two first signal lines;
    wherein the first array is defined as the first three rows of the BGA, and the second array disposed adjacent to the first array is defined as the last three rows of the BGA;
    wherein the ratio of the number of first solder balls used for receiving signals to the number of first solder balls grounded is 4 to 1.

2. The BGA according to claim 1, wherein the center-to-center distance between any two adjacent first solder balls of the first solder ball module is substantially 0.8 mm.

3. The BGA according to claim 1, wherein the first row of the first solder ball module is configured to face the signal traces disposed on the printed circuit board connecting the first solder ball module, wherein the grounded first solder ball is located at the third row of the first solder ball module, and the floating first solder ball is located at the first row of the first solder ball module.

4. The BGA according to claim 1, wherein the number of second solder balls disposed in the second solder ball module is equal to the number of first solder balls disposed in the first solder ball module, and the two grounded second solder balls are located at the third row of the second solder ball module.

5. The BGA according to claim 1, comprising:
    a third solder ball module, arranged parallel to the first solder ball module, the third solder balls comprising a plurality of third solder balls, wherein one of the third solder balls is grounded for shielding two other third solder balls among the third solder balls, and one of the third solder balls is floating, wherein the third solder ball module employs substantially the same solder ball arrangement as the first solder ball module; and
    a fourth solder ball module comprising a plurality of fourth solder balls, wherein two of the fourth solder balls are grounded and one of the grounded fourth solder balls penetrates the printed circuit board through a plated through hole formed on the printed circuit board for shielding two third solder balls among the third solder balls, wherein the fourth solder ball module employs substantially the same solder ball arrangement as the second solder ball module.

6. The BGA according to claim 5, wherein the first row of the third solder ball module is configured to face the signal traces signal traces disposed on the printed circuit board connecting the third solder ball module, and the grounded third solder ball is located at the third row of the third solder ball module, and the floating third solder ball is located at the first row of the third solder ball module, wherein the number of fourth solder balls disposed in the fourth solder ball module is equal to the number of third solder balls disposed in the third solder ball module, and the grounded fourth solder balls are located at the third row of the fourth solder ball module.

7. The BGA according to claim 1, wherein the BGA is applied to a double-data-rate (DDR) dynamic random access memory (DRAM) and the printed circuit board is a two-layer printed circuit board.

8. A Ball Grid Array (BGA) formed on a printed circuit board (PCB), the BGA comprising:
    a first solder ball module comprising a plurality of first solder balls arranged to form a first array, wherein two of the first solder balls are grounded for shielding the remaining first solder balls of the first solder ball module;

a plurality of first signal lines and two first ground lines respectively coupled to the first solder balls;

a second solder ball module comprising a plurality of second solder balls arranged to form a second array, wherein two of the second solder balls are grounded, wherein the first array is defined as the first three rows of the BGA, and the second array disposed adjacent to the first array is defined as the last three rows of the BGA; and wherein each of the two first ground lines directly connected to the first solder balls that are grounded is disposed adjacent to and parallel with respective two of the first signal lines, and the two first wound lines are not coupled to a via adjacent to the first solder balls that are grounded;

wherein the ratio of the number of first solder balls used for receiving signals to the number of first solder balls grounded is 2 to 1.

9. The BGA according to claim 8, wherein the center-to-center distance between any two adjacent first solder balls of the first solder ball module is substantially 1 mm.

10. The BGA according to claim 8, wherein the first row of the first solder ball module is configured to face the signal traces disposed on the printed circuit board connecting the first solder ball module, and the grounded first solder ball is located at the third row of the first solder ball module.

11. The BGA according to claim 8, wherein the number of second solder balls disposed in the second solder ball module is equal to the number of first solder balls disposed in the first solder ball module, and the two grounded second solder balls are located at the third row of the second solder ball module.

12. The BGA according to claim 8, further comprising:
a third solder ball module, arranged parallel to the first solder ball module, the third solder ball module comprising a plurality of third solder balls, wherein two of the third solder balls are grounded for shielding the remaining third solder balls of the third solder ball module, wherein the third solder ball module employs substantially the same solder ball arrangement as the first solder ball module; and
a fourth solder ball module comprising a plurality of fourth solder balls, wherein two of the fourth solder balls are grounded, and the fourth solder ball module employs substantially the same solder ball arrangement as the second solder ball module.

13. The BGA according to claim 12, wherein the first row of the third solder ball module is configured to face the signal traces signal traces disposed on the printed circuit board connecting the third solder ball module, and the grounded third solder balls are located at the third row of the third solder ball module, wherein the number of fourth solder balls disposed in the fourth solder ball module is equal to the number of third solder balls disposed in the third solder ball module, and the grounded fourth solder balls are located at the third row of the fourth solder ball module.

14. The BGA according to claim 8, wherein the BGA is applied to a double-data-rate (DDR) dynamic random access memory (DRAM).

15. A Ball Grid Array (BGA) formed on a printed circuit board (PCB), the BGA comprising:
a first solder ball module comprising a plurality of first solder balls arranged to form a first array, wherein at least three of the first solder balls are either grounded receive a power voltage applied for shielding the remaining first solder balls of the first solder module, and one of the first solder balls is floating;
a plurality of first signal lines and at least three first ground or power lines respectively coupled to the first solder balls;
a second solder ball module comprising a plurality of second solder balls arranged to form a second array, the configuration, the number, and the disposition associated with the second solder balls of the second solder ball module are substantially the same as that of the first solder balls in the first solder ball module; and
wherein each of the at least three first ground or power lines that are directly connected to the first solder balls is disposed adjacent to and parallel with a respective one of the first signal lines, and the at least three first ground or power lines are not coupled to a via adjacent to the first solder balls;
wherein the first array is defined as the first three rows of the BGA, and the second array disposed adjacent to the first array is defined as the last three rows of the BGA.

16. The BGA according to claim 15, wherein the first row of the first solder ball module is configured to face the signal traces disposed on the printed circuit board connecting the first solder ball module, wherein the first solder balls that are grounded or receive the power voltage are located at the second row of the first solder ball module, and the floating first solder ball is located at the first row of the first solder ball module.

17. The BGA according to claim 15, wherein the number of first solder balls disposed in the first solder ball module is nine and the number of first solder balls grounded or receiving the power voltage is four.

18. The BGA according to claim 15, wherein the BGA is applied to a double-data-rate (DDR) dynamic random access memory (DRAM).

* * * * *